US012687573B2

(12) United States Patent
Myerscough-Jackopson

(10) Patent No.: US 12,687,573 B2
(45) Date of Patent: Jul. 21, 2026

(54) MEASUREMENT INSTRUMENT AND SYSTEM FOR ENHANCED CONSTELLATION DIAGRAMS AND METHOD THEREOF

(71) Applicant: Rohde & Schwarz GmbH & Co. KG, Munich (DE)

(72) Inventor: Peter Myerscough-Jackopson, North Baddesley (GB)

(73) Assignee: Rohde & Schwarz GmbH & Co. KG, Munich (DE)

( * ) Notice: Subject to any disclaimer, the term of this patent is extended or adjusted under 35 U.S.C. 154(b) by 390 days.

(21) Appl. No.: 18/511,938

(22) Filed: Nov. 16, 2023

(65) Prior Publication Data

US 2025/0164546 A1     May 22, 2025

(51) Int. Cl.
*H04B 17/00* (2015.01)
*G01R 31/28* (2006.01)
*H04B 17/29* (2015.01)

(52) U.S. Cl.
CPC ..... *G01R 31/2822* (2013.01); *H04B 17/0085* (2013.01); *H04B 17/296* (2023.05)

(58) Field of Classification Search
CPC .. H04B 17/0085; H04B 17/296; H04B 17/23; G01R 31/2822
See application file for complete search history.

(56) References Cited

U.S. PATENT DOCUMENTS

| | | | | |
|---|---|---|---|---|
| 5,831,440 | A * | 11/1998 | Oldfield | G01R 27/06 |
| | | | | 324/637 |
| 6,973,401 | B2 | 12/2005 | Eibl et al. | |
| 10,020,830 | B2 | 7/2018 | Roth et al. | |
| 10,033,554 | B1 * | 7/2018 | Gines | H04L 25/03012 |
| 10,200,085 | B1 * | 2/2019 | Gines | H04B 3/487 |
| 10,469,296 | B1 * | 11/2019 | Noujeim | H04L 27/38 |
| 10,756,829 | B1 * | 8/2020 | Therrien | G05B 23/0221 |
| 11,742,970 | B1 * | 8/2023 | Cao | H04B 17/345 |
| | | | | 375/262 |
| 11,817,913 | B1 * | 11/2023 | Cao | G01R 31/2822 |
| 11,852,658 | B2 * | 12/2023 | Peschke | G01R 13/22 |
| 12,345,761 | B2 * | 7/2025 | Zhai | G01R 31/2815 |
| 12,537,609 | B2 * | 1/2026 | Orozco | H04B 17/0085 |
| 2003/0012289 | A1 * | 1/2003 | Lindoff | H04L 25/03834 |
| | | | | 375/296 |
| 2004/0140819 | A1 * | 7/2004 | McTigue | G01R 1/06766 |
| | | | | 324/720 |

(Continued)

*Primary Examiner* — Dominic E Rego
(74) *Attorney, Agent, or Firm* — Westman, Champlin & Koehler, P.A.

(57) ABSTRACT

The present invention relates to a measurement instrument comprising: at least a first and a second input paths, wherein each input path is configured to receive a corresponding measurement signal from a device under test, wherein each measurement signal comprises a number of states; a calculation device connected to the at least first and second input paths, configured to calculate an error vector corresponding to each state of each measurement signal, and to produce an average error vector for each state based on the error vectors of each measurement signal corresponding to the same state; and a display device, adapted to create a constellation diagram based on the produced average error vector for each state.

18 Claims, 3 Drawing Sheets

(56)                References Cited

U.S. PATENT DOCUMENTS

| 2005/0186914 | A1* | 8/2005 | Heaton | H04W 24/00 |
| | | | | 455/67.11 |
| 2008/0012851 | A1* | 1/2008 | Bae | G06T 17/00 |
| | | | | 345/419 |
| 2011/0141934 | A1* | 6/2011 | Aoki | H04B 17/23 |
| | | | | 370/252 |
| 2013/0191104 | A1* | 7/2013 | Ceperic | G06F 30/31 |
| | | | | 703/14 |
| 2013/0303098 | A1* | 11/2013 | Carlsson | H04B 17/29 |
| | | | | 455/226.1 |
| 2015/0002136 | A1* | 1/2015 | McTigue | G01R 1/06788 |
| | | | | 324/123 R |
| 2015/0160264 | A1* | 6/2015 | Rada | G01R 31/3025 |
| | | | | 324/754.21 |
| 2015/0304075 | A1* | 10/2015 | Ahmed | H04L 27/2637 |
| | | | | 375/228 |
| 2016/0072470 | A1* | 3/2016 | Lin | H03H 7/463 |
| | | | | 333/132 |
| 2016/0139178 | A1* | 5/2016 | Johnson | G01R 1/067 |
| | | | | 324/754.03 |
| 2017/0155476 | A1* | 6/2017 | Polehn | H04L 27/22 |
| 2018/0080965 | A1* | 3/2018 | Stein | H04B 3/462 |
| 2018/0262322 | A1* | 9/2018 | Yoshioka | H04L 27/227 |
| 2020/0212849 | A1* | 7/2020 | Kobayashi | H03F 3/195 |
| 2021/0063440 | A1* | 3/2021 | Swaim | G01R 19/25 |
| 2021/0273747 | A1* | 9/2021 | Mackenzie | H04L 1/0078 |
| 2021/0351714 | A1* | 11/2021 | Biris | H02M 5/4585 |
| 2021/0405863 | A1* | 12/2021 | Chen | G06F 3/04883 |
| 2022/0045699 | A1* | 2/2022 | Germer | H04B 1/0039 |
| 2022/0065972 | A1* | 3/2022 | Chaudhary | G01R 35/005 |
| 2022/0400449 | A1* | 12/2022 | Mori | H04B 1/0007 |
| 2023/0109932 | A1* | 4/2023 | Kobayashi | H03F 3/602 |
| | | | | 330/103 |
| 2023/0258703 | A1* | 8/2023 | Wen | G01R 29/0892 |
| | | | | 324/637 |
| 2024/0019470 | A1* | 1/2024 | Wendler | G01R 19/0053 |
| 2024/0235699 | A1* | 7/2024 | Orozco | H04B 17/102 |
| 2024/0319248 | A1* | 9/2024 | Ramian | G01R 29/26 |
| 2025/0067782 | A1* | 2/2025 | Mohindra | G01R 29/06 |
| 2025/0093450 | A1* | 3/2025 | Ramian | G01R 35/00 |
| 2025/0138072 | A1* | 5/2025 | Kuhn | G01R 23/163 |
| 2026/0039253 | A1* | 2/2026 | Kobayashi | H03F 1/0288 |

* cited by examiner

MEASUREMENT INSTRUMENT AND SYSTEM FOR ENHANCED CONSTELLATION DIAGRAMS AND METHOD THEREOF

TECHNICAL FIELD

The present invention relates to a measurement instrument and system for the generation and display of constellation diagrams. The invention further relates to a corresponding method for the generation of a constellation diagram.

BACKGROUND OF THE INVENTION

The measurement instrument disclosed hereinafter is mostly described with respect to measurements of a device under test (DUT). The scope of the invention is, however, not limited to this particular application, and the principles of the invention described below can be applied to signals coming from any emitting device.

Constellation diagrams are widely used to characterize the information that can be transmitted by a signal modulated using a digital modulation scheme. In a constellation diagram, the signal is represented as points in a two-dimensional plane which contains information about the phase shift and amplitude power of the signal. Each point represents one of the possible states of the signal and it is marked with a symbol that may comprise a number of bits. The number of symbols is determined by the modulation deployed and is a measure of the information that can be transmitted with the signal.

The constellation points in a constellation diagram represent ideal or reference points of the signal. In practice, the generation of a constellation diagram involves the use of some hardware, which introduces electronic noise and distortion to the signal. The measured states of a signal in general differ from the reference states as shown by an ideal constellation diagram, and an offset is generated.

If the offset is bigger than the mean distance between symbols, the signal can mistakenly be attributed to a different symbol. This misclassification or misidentification causes a symbol error and thus a deterioration of the signal quality.

There are different methods and techniques to reduce the noise level induced by the signal going through hardware. A commonly used technique is the cross correlation, where different signal channels are combined in order to identify correlated noise (e.g., coming from a device under test) from uncorrelated noise (e.g., specific to the channel) and reduce the latter. Cross correlation of two signals is performed by taking the product of the two signals and averaging out over a number of measurements. By averaging over a sufficient number of measurements, the uncorrelated noise can be suppressed.

A suitable noise reduction technique for the generation of improved constellation diagrams can be used to increase both the measurement accuracy and the sensitivity.

SUMMARY OF THE INVENTION

Against this background, there is the need to generate constellation diagrams having enhanced quality.

Accordingly, the present invention provides a measurement instrument, a measurement system and a method having the features recited in the independent claims.

A first aspect of the invention provides a measurement instrument comprising: at least a first and a second input paths, wherein each input path is configured to receive a corresponding measurement signal from a device under test, wherein each measurement signal comprises a number of states; a calculation device connected to the at least first and second input paths, configured to calculate an error vector corresponding to each state of each measurement signal, and to produce an average error vector for each state based on the error vectors of each measurement signal corresponding to the same state; and a display device, adapted to create a constellation diagram based on the produced average error vector for each state.

In the present invention, a measurement instrument refers to a generic device used for the determination of electrical properties of a device under test. A measurement instrument is accordingly any device that can receive signals from a device under test, process them and extract information for the characterization of the device under test. The measurement instrument can consist of a single device, or of a number of interconnected devices (cable-bound or wireless). The measurement device may be realized in hardware, software or in any combination thereof.

A measurement signal is an electric signal (digital or analog) that contains information about a measurement of the features of a device under test. The measurement signals are originated from the same device under test. They can be, in particular, split signals coming from a splitter. The measurement signal can correspond to a modulated signal, in particular an I/Q modulated signal.

The number of states (or number of symbols) comprised in each the measurement signal corresponds to the different (discrete) combinations of amplitude and phase that the signal can convey. Each state or symbol can be represented as a bit combination and also as a point in a constellation diagram. The number of states depends on the modulation scheme used.

The calculation device and the display device are to be broadly understood as entities capable of acquiring, obtaining, receiving or retrieving electromagnetic signals and extracting information thereof for its processing.

Both, the calculation device and the display device, may therefore contain at least a central processing unit, CPU, and/or at least one field-programmable gate array, FPGA, and/or at least one application-specific integrated circuit, ASIC and/or any combination of the foregoing. They may further comprise a working memory operatively connected to the at least one CPU and/or a non-transitory memory operatively connected to the at least one CPU and/or the working memory. The display device can further contain at least one graphics processing unit, GPU, and a user interface, in particular a graphical user interface.

Both the calculation device and the display device can be adapted to run programming code and/or executable programs, including applications and algorithms, and to deliver the results for further processing. The calculation device may comprise an interface to an intranet or the Internet, to a cloud computing service, to a remote server and/or the like.

An error vector refers to a two-dimensional vector, whose components contain information about the deviation between a reference point and a measured point. The components of the error vector parametrize this deviation in terms of the amplitude and phase of the signal. If the error vector is to be plotted in a constellation diagram, the components of the vector correspond to the quadrature and in-phase components as obtained after a I/Q modulation (or QAM) of a signal.

Under an average error vector is to be understood an error vector obtained from the error vectors through one or more mathematical operations aimed at finding a representative of the error vectors. An average error vector can be based on an arithmetic mean or any other type of mean.

A second aspect of the present invention provides a method for creating a constellation diagram, comprising: providing a measurement instrument with at least a first and a second input paths, a calculation device connected to the at least first and second input paths, and a display device; receiving at the at least first input path and second input path a corresponding measurement signal from a device under test, wherein each measurement signal comprises a number of states; calculating an error vector corresponding to each state of each measurement signal; producing an average error vector for each state based on the error vectors of each measurement signal corresponding to the same state; and creating a constellation diagram based on the produced average error vector for each state.

In particular, the method according to the second aspect of the invention may be carried out using the measurement instrument according to the first aspect of the invention. The features and advantages disclosed herein in connection with the circuit arrangement of the invention are therefore also disclosed for the method, and vice versa.

According to a third aspect, the invention provides a measurement system, with a radiofrequency splitter circuit, configured to generate at least two channels by splitting a signal from a device under test into at least a first split measurement signal and a second split measurement signal, and a measurement instrument. The measurement instrument comprises at least a first and a second input paths, wherein each input path is configured to receive a corresponding measurement signal from a device under test, wherein each measurement signal comprises a number of states; a calculation device connected to the at least first and second input paths, configured to calculate an error vector corresponding to each state of each measurement signal, and to produce an average error vector for each state based on the error vectors of each measurement signal corresponding to the same state; and a display device, adapted to create a constellation diagram based on the produced average error vector for each state.

The measurement instrument is configured to receive each of the channels generated by the radiofrequency splitter circuit at a corresponding input path.

The radiofrequency splitter circuit can be a single N-way splitter and/or it can comprise a number of two-way splitters, connected, e.g., in a tree-like diagram fashion.

One of the main ideas underlying the present invention is to provide a measurement instrument adapted to create and display a constellation diagram for a device under test with an improved reduction of the noise caused by the measurement instrument. This is achieved by determining the error vectors for each of the symbols of the received measurement signals and performing an average of those errors for each symbol. The resulting average can then be plotted as a constellation diagram point. The averaging procedure makes sure that the effects of uncorrelated errors are reduced.

The measurement instrument as described above allows for a simple implementation of a method, comprising a number of steps. In one step, a number of measurements signals from a device under test are received at the different input paths of the measurement instrument, where each measurement signal comprises a number of states. In another step, error vectors are calculated for each of the states of each measurement signal. Based thereupon, an average error vector for each state is produced. The whole number of average error vectors, one for each symbol, are finally plotted in a constellation diagram.

One advantage of the present invention is that a better quality constellation diagram for a device under test is provided. This is achieved by combining the measurement signals of the device under test coming into the different input paths of the measurement device of the invention. The uncorrelated or random part of the error vector, which depends on the path followed by the signal between the device under test and the calculation device of the measurement instrument, is reduced by the process of averaging. In other words, the average error vector contains a smaller uncorrelated portion of the error compared with the separate error vectors calculated from the signals received at each input path.

Another advantage of the present invention is that it is straightforwardly implementable for an arbitrary number of input paths.

Advantageous embodiments and further developments follow from the dependent claims as well as from the description of the different preferred embodiments illustrated in the accompanying figures.

According to some embodiments, refinements, or variants of embodiments, the measurement signals are radiofrequency signals. The invention is mostly focused on, albeit not confined to, measurements involving devices under test adapted to receive, emit or transmit radio waves.

According to some embodiments, refinements, or variants of embodiments, the measurement instrument further comprises additional input paths, configured to receive each an additional measurement signal, wherein the calculation device is connected to these additional input paths. Increasing the number of input paths can be advantageous in that the amount of uncorrelated error of the average error vector decreases as the number of error vectors used in the average increases.

According to some embodiments, refinements, or variants of embodiments, the received measurement signals correspond to the different channels generated by a radiofrequency splitter. An alternative to feeding each input path with sequentially generated measurement signals from the device under test is to use a splitter to split a measurement signal into a number of split signals, which can be fed into the input paths. This can allow, in general, for a faster operation of the measurement instrument.

According to some embodiments, refinements, or variants of embodiments, the measurement instrument is at least one of: a wireless communication test device, a test and measurement device for broadcasting, a signal analyzer, a spectrum analyzer, and a mobile network testing device. Other testing and measurement devices can be also considered a measurement instrument as described in this invention, in which a measurement instrument comprises any device used for the determination of electrical properties of a device under test.

According to some embodiments, refinements, or variants of embodiments, the calculation device is further configured to compute, based on the calculated error vectors, at least one of an error vector magnitude and a modulation error ratio. Aside from the average error vector, which is a quantity displayed in the constellation diagram, the error vector magnitude (EVM) and the modulation error ratio (MER), also referred to as signal to noise ratio (SNR), are also figures of merit used to quantify the performance of a device or of a communication channel. The EVM of a constellation diagram with N constellation points can be defined as the root mean square of the average error vectors for each symbol j, $\vec{e}_j=(e_{1j}, e_{2j})$, i.e., $$EVM = \frac{1}{d}\sqrt{\frac{1}{N}\sum_{j=1}^{N}\left(e_{1j}{}^2 + e_{2j}{}^2\right)}$$

where the normalization factor d stands for an ideal signal amplitude reference, which is normally taken to be either the maximum ideal signal amplitude of all the constellation points, or the root mean square average amplitude of all possible ideal signal amplitude values in the constellation diagram.

The MER is instead computed as the ratio of the signal power to the error power, where the error power is the root mean square of the average error vector corresponding to each symbol and the signal power can be derived from the constellation points displayed by the display device for each symbol.

According to some embodiments, refinements, or variants of embodiments, the measurement instrument further comprises a number of analog to digital converters (ADCs) arranged at each input path, configured to convert a received analog measurement signal into a corresponding digital measurement signal. Constellation diagrams are based on digitally modulated signals. If a measurement signal is an analog signal it has to be converted to a digital signal. Providing ADCs as part of the measuring instrument enables the invention to be applied to both digital and analog signals without the need of external ADCs.

According to some embodiments, refinements, or variants of embodiments, the error vector corresponding to a state is calculated based on the difference between the state of the received measurement signal and a predetermined reference signal for the state. The reference signal can correspond to the points of an ideal constellation diagram.

According to some embodiments, refinements, or variants of embodiments, the average error vector corresponding to a state is a vector whose components are the arithmetic mean of the components of the error vectors corresponding to the state.

Given n measurement signals with error vectors $\vec{e}_j=(e_1, e_{2j})$, with j=1, . . . , n, the average error vector for a given constellation point can be defined as $e_A=(e_{A1}, e_{A2})$, where its components are given by $$e_{A1} = \frac{1}{n}\sum_{j=1}^{n}e_{1j}; \; e_{A2} = \frac{1}{n}\sum_{j=1}^{n}e_{2j}$$

According to some embodiments, refinements, or variants of embodiments, the average error vector corresponding to one state is the shortest vector of a group of vectors comprising the error vectors of each measurement signal for the one state and a vector whose components are the arithmetic mean of the components of the error vectors of each measurement signal for the one state.

For some hardware configurations, it might be that one of the input paths performs much better than the others, i.e., that its error vector is smaller an average based on a mean. The measurement instrument can check if this is the case and take this error vector as the average error vector.

According to some embodiments, refinements, or variants of embodiments, the display device is further configured to display the error vectors corresponding to each state of the measurement signals. Having information not just about the average error vector for each state but also about the individual error vectors for each of the measurement signals can help detect biases and provide a way to improve the sensitivity of the measurement instrument.

According to some embodiments, refinements, or variants of embodiments, the calculation device comprises a database unit, configured to store a two-dimensional reference point corresponding to each state. With this information a signal space diagram (or an ideal constellation signal) can be generated.

The database unit can comprise reference points corresponding to different kinds of possible devices under test. These reference points are in one to one correspondence with the reference signals used to compute the error vectors.

According to some embodiments, refinements, or variants of embodiments, the display device is configured to create the constellation diagram by placing the produced average error vector for each state on a two-dimensional plot, and wherein the origin of the produced average error vector for each state is the reference point corresponding to each state which is stored in the database unit of the calculation device. The axes of the two-dimensional plot can represent the quadrature and in-phase components of each of the vectors and reference points.

According to some embodiments, refinements, or variants of embodiments, the calculation device comprises a vector signal analyzer unit, connected to at least one of the input paths and configured to calculate the error vectors associated to the measurement signal received by the at least one input path.

Vector signal analyzers are instruments adapted to measure the magnitude and phase of signals. A vector signal analyzer can comprise at least a voltage-controlled oscillator, a mixer, a filter, an analog-to-digital converter (ADC), and a quadrature detector. The quadrature detector can separate the signal digitized with the ADC into quadrature and in-phase components, from which the error vectors can be determined.

Where appropriate, the above-mentioned configurations and implementations can be combined with each other as desired, as far as this is reasonable.

Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

BRIEF DESCRIPTION OF THE DRAWINGS

The present invention is described in greater detail in the following on the basis of the embodiments shown in the schematic figures of the drawings, in which.

7

Figure 3:
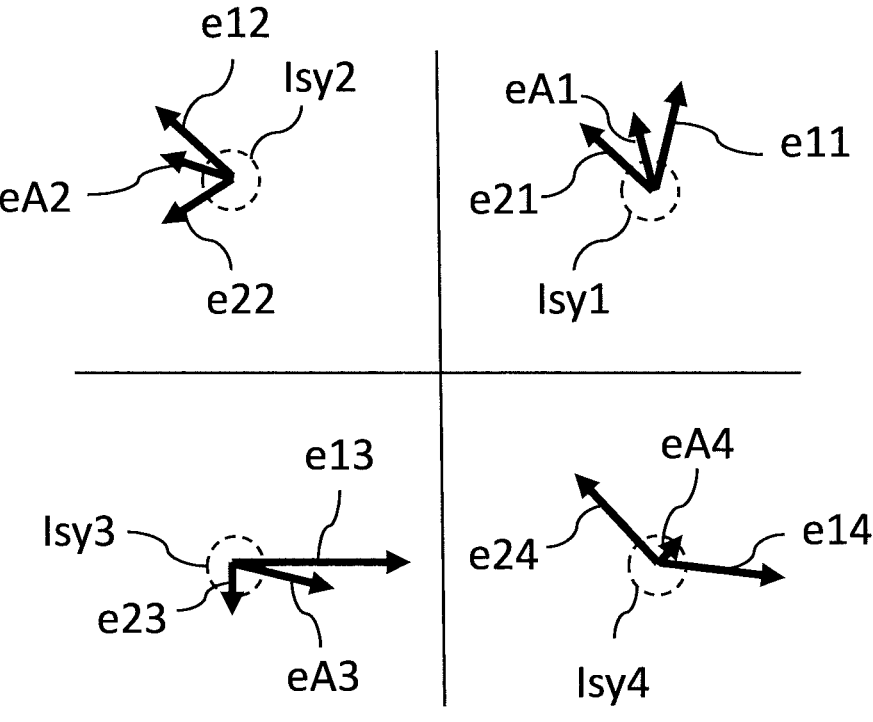
FIG. 3 is a schematic representation of an ideal constellation diagram, including error vectors calculated and average error vectors produced according to an embodiment of the present invention.
Figure 4:
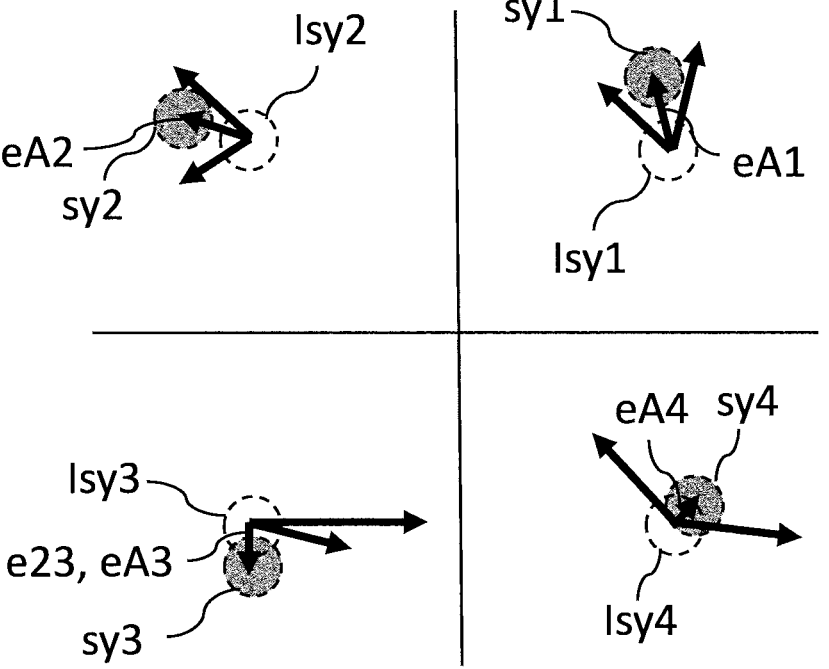
Figure 5:
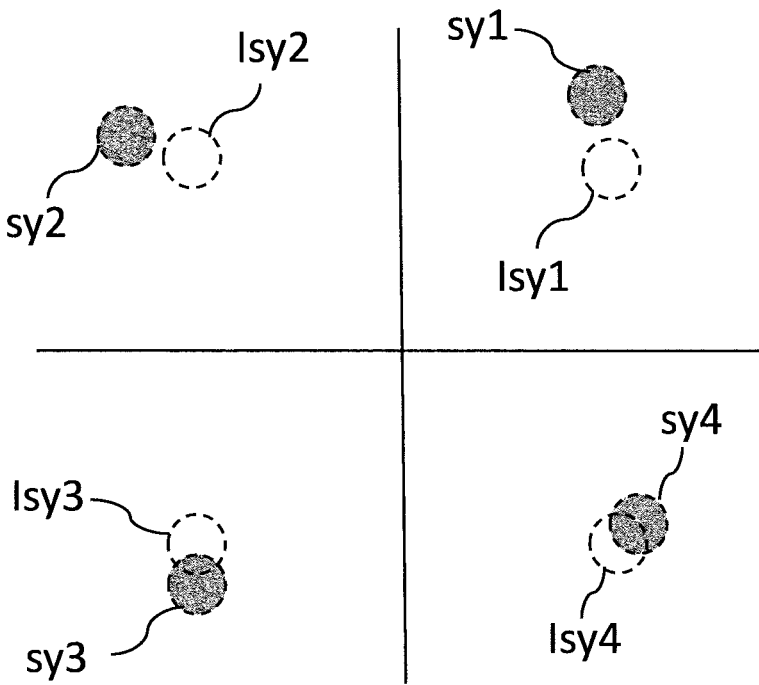
Figure 6:
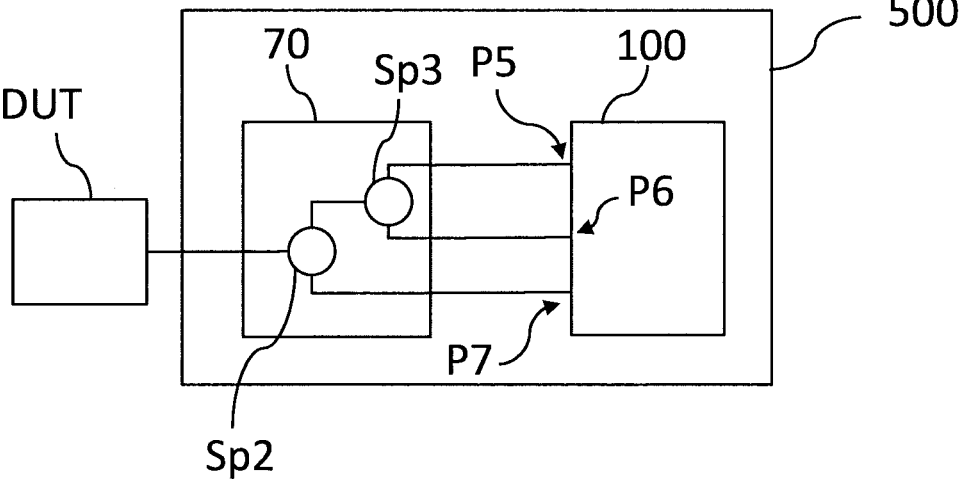

FIG. 4 is a schematic representation of the ideal constellation diagram of FIG. 3 and a created constellation diagram according to an embodiment of the present invention;

FIG. 5 is a schematic representation of the ideal constellation diagram of FIG. 3 and a created constellation diagram according to another embodiment of the present invention; and FIG. 6 is a schematic representation of a measurement system according to an embodiment of the third aspect of the invention, comprising a radiofrequency splitter circuit and a measurement instrument according to an embodiment of the first aspect of the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

The detailed description includes specific details for the purpose of providing a thorough understanding of the present invention. However, it will be apparent to those skilled in the art that the present invention may be practised without these specific details.

The numeration of the steps in the methods are meant to ease their description. They do not necessarily imply a certain ordering of the steps. In particular, several steps may be performed concurrently.

Figure 1:
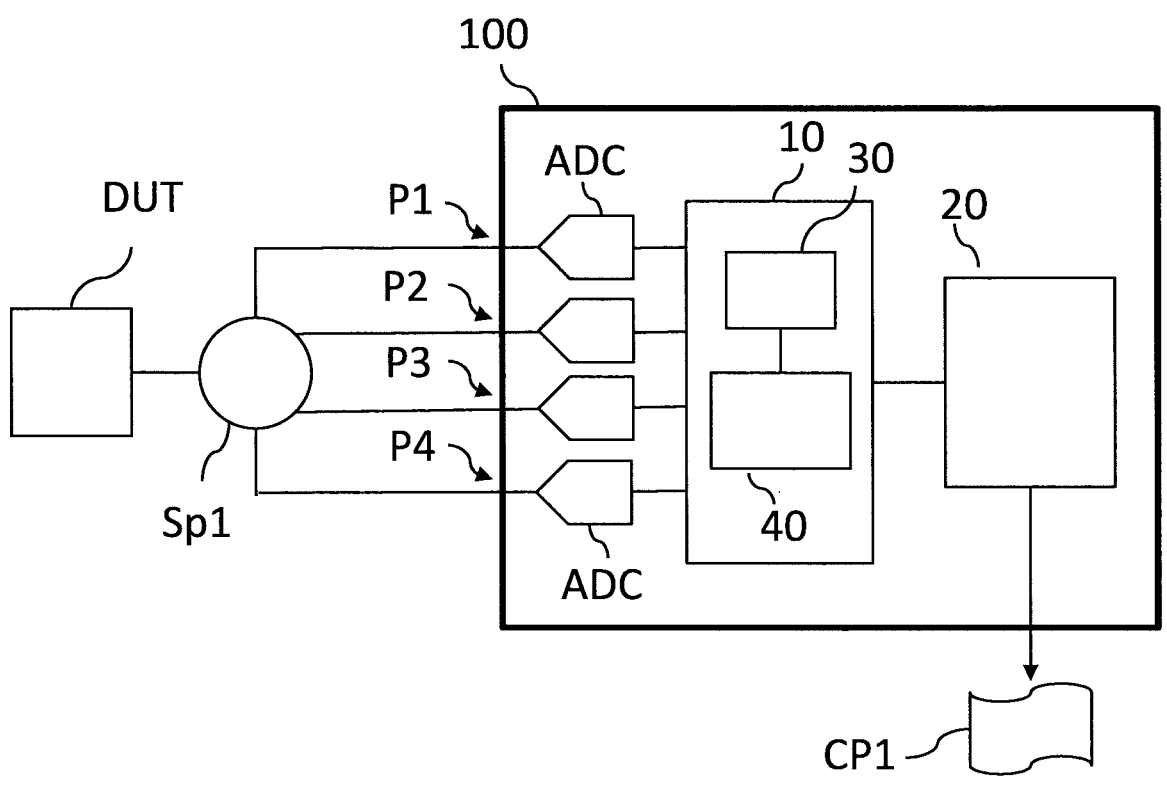
FIG. 1 is a schematic depiction of a measurement instrument according to an embodiment of the present invention.

FIG. 1 shows a schematic depiction of a measurement instrument 100 according to an embodiment of the present invention. The measurement instrument 100 can be, e.g., a wireless communication test device, a test and measurement device for broadcasting, a signal analyzer, a spectrum analyzer, or a mobile network testing device. A measurement instrument according to the first aspect of the invention comprises at least two input paths. The embodiment of the measurement instrument 100 depicted in FIG. 1, for the purposes of illustration, comprises four input paths P1 to P4. The measurement instrument 100 also comprises a calculation device 10 and a display device 20.

The input paths P1 to P4 are adapted to receive a measurement signal each. The first input path P1 can receive a first measurement signal, the second input path P2 a second measurement signal, the third input path P3 a third measurement signal, and the fourth input path P4 a fourth measurement signal. In the embodiment illustrated in FIG. 1, a device under test DUT emits a measurement signal, which is received by a 4-way signal splitter Sp1, which splits the received measurement signal into the first, second, third and fourth measurement signals to be received at the input paths P1 to P4.

The input paths P1 to P4 are adapted to receive either digital or analog measurement signals. In case the signals are analog measurement signals, the measurement instrument 100 can be provided with one analog-to-digital converter ADC connected to each of the input paths P1 to P4, which converts the analog measurement signals received by the input paths P1 to P4 into digital measurement signals.

In other embodiments of this invention (not shown in the figures of the drawings), a dual ADC can be connected to one or more of the input paths P1 to P4. If the measurement signal has undergone an analog I/Q modulation, one of the ADC of the dual ADC can be adapted to process the in-phase component of the measurement signal, and the other ADC of the dual ADC can be adapted to process the quadrature component of the measurement signal.

The measurement signals are typically I/Q modulated signals, which comprise a number of states that determine the information that can be transmitted with the signal. The number of states is determined by the modulation scheme. FIGS. 3 to 5 show, for instance, a rectangular 4-QAM scheme, which comprises four states. The measurement signals are preferably radiofrequency signals, which correspond to devices under test DUTs adapted to receive, emit or transmit radio waves.

The calculation device 10 is connected to the input paths P1 to P4, and configured to calculate an error vector corresponding to each state of each measurement signal. The error vector corresponding to a state is calculated based on the difference between the state of the received measurement signal and a predetermined reference signal for the same state. Error vectors are two-dimensional vectors whose components can contain information about the quadrature and in-phase deviation of the measurement signal with respect to the reference signal.

Error vectors can be calculated with a vector signal analyzer unit 40, which can contain one or more vector signal analyzers. Vector signal analyzers are instruments adapted to measure the magnitude and phase of signals. A vector signal analyzer can comprise at least a voltage-controlled oscillator, a mixer, a filter, an analog-to-digital converter (ADC), and a quadrature detector. The quadrature detector can separate the signal digitized with the ADC into quadrature and in-phase components, from which the error vectors can be determined.

The calculation device 10 is further configured to produce an average error vector for each state based on the error vectors of each measurement signal corresponding to the same state. There are different ways of evaluating the average error vector. The average error vector corresponding to a state can be a vector whose components are the arithmetic mean of the components of the error vectors corresponding to the same state.

Referring to FIG. 1, given the four received measurement signals with calculated error vectors $\vec{e}_j=(e_1, e_{2j})$, with j=1, . . . , 4, the average error vector for a given constellation point can be defined as $\vec{e}_A=(e_{A1}, e_{A2})$, where its components are given by $$e_{A1} = \frac{1}{4}\sum_{j=1}^{4}e_{1j}; e_{A2} = \frac{1}{4}\sum_{j=1}^{4}e_{2j}$$

The average error vector corresponding to a state can also be determined as the shortest vector of a group of vectors comprising the error vectors of each measurement signal for the one state and a vector whose components are the arithmetic mean of the components of the error vectors of each measurement signal for the one state.

The calculation device 10 can also be configured to compute the error vector magnitude (EVM) and/or the modulation error ratio (MER), which quantify the performance of the measurement signal.

The calculation device 10 can comprise a database unit 30, configured to store a two-dimensional reference point corresponding to each state. With this information, a signal space diagram (or an ideal constellation signal) can be generated. The database unit 30 can comprise reference points corresponding to different kinds of possible devices under test DUTs.

The display device 20 is connected to the calculation device 10 and adapted to create a constellation diagram CP1 based on the produced average error vector for each state. The constellation diagram CP1 can be a I/Q diagram, in which the axes of the two-dimensional plot can indicate the quadrature and in-phase components of each of the vectors and reference signals (represented as reference points in the I/Q diagram).

The display device 20 can comprise a graphics processing unit, GPU, and a user interface, in particular a graphical user interface. In some embodiments, some of the information can be displayed to a user with a graphical user interface, which can be a touch user interface, together with a menu-driven user interface.

Figure 2:
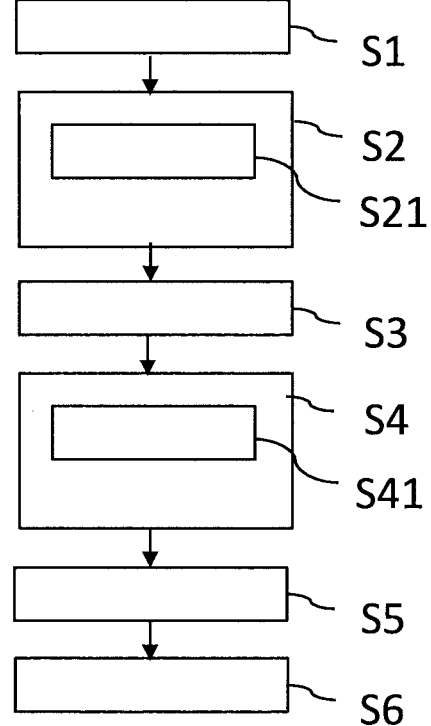
FIG. 2 is a flowchart showing an exemplary embodiment of a method for creating a constellation diagram according to an embodiment of the present invention.

FIG. 2 is a flowchart showing an exemplary embodiment of a method for creating a constellation diagram according to an embodiment of the present invention. The method can be preferably implemented using at least one of the measurement instrument 100 described with respect to FIG. 1, and the measurement system 500 described with respect to FIG. 6. The method comprises a number of steps.

In a step S1, a measurement instrument 100 is provided. The measurement instrument comprises at least a first input path P1 and a second input path P2 (e.g., in FIG. 1 four input paths P1-P4 are shown), a calculation device 10 connected to the at least first input path P1 and second input path P2, and a display device 20.

In a step S2, a measurement signal is received at each of the input paths P1 to P4. Each of the measurement signals comprises a number of states or symbols, which correspond to the different discrete combinations of amplitude and phase that the measurement signal can convey. The measurement signal can be a modulated signal, preferably modulated with a quadrature amplitude modulator (QAM). Each state or symbol can be represented as a bit combination, where the number of states depends on the modulation scheme used for the modulation of the measurement signal.

In some embodiments of the invention, the step S2 comprises a step 21, where at least some of the measurement signals are generated by a radiofrequency splitter, which splits at least some of the measurements signals into corresponding split measurement signals, which are received by some of the input paths P1-P4 of the measurement instrument 100.

In another step S3, an error vector corresponding to each state of each measurement signal is calculated. This can be done with the vector signal analyzer unit 40 of the calculation device 10. The error vector for each symbol can be represented as a two-dimensional vector, whose components are the deviation of the quadrature and in-phase components of the corresponding state of the measurement signal with respect to a reference point. The number of error vectors per symbol is determined by the number of input paths P1-P4 of the measurement instrument 100.

In a subsequent step S4, an average error vector for each state is produced. This average error vector is based on the error vectors of each measurement signal corresponding to the same state. The average error vector corresponding to one state can be a vector whose components are the arithmetic mean of the components of the error vectors of each measurement signal for that one state. In some embodiments of the invention, such as the one depicted in FIG. 2, producing the average error vector in step S4 comprises a step S41, where the shortest vector of a group of vectors for each state is selected and taken as the average error vector for that state. This group of vectors comprises: 1) the error vectors of each measurement signal for the one state under consideration, and 2) a vector whose components are the arithmetic mean of the components of the error vectors of each measurement signal for the one state.

In another step S5, a constellation diagram CT1 is created, i.e., generated and displayed, e.g., through a graphical user interface. This constellation diagram CT1 has a number of points, which correspond to the different states of the measurement signals and are determined by the average error vectors produced in step S4. For the created constellation diagram CP1 there may be different display modes. In one mode, the constellation diagram points are displayed alone. In another mode, the constellation diagram points are displayed together with the ideal constellation diagram. In yet another mode, the constellation diagram points are displayed together with all or a subset of the error vectors and average error vectors. In some embodiments, some of the information is displayed to a user with a graphical user interface, which can be a touch user interface, and a menu-driven user interface.

In some embodiments of the invention, the method comprises a step S6, where at least one of an error vector magnitude (EVM) and a modulation error ratio (MER) are computed. These quantities are a measure of the quality of the measurements and can be computed from the calculated error vectors.

FIG. 3 illustrates, in a schematic representation, an ideal constellation diagram where calculated error vectors and produced average error vectors determined according to an embodiment of the present invention are depicted.

In FIG. 3 it is shown an ideal constellation diagram with four symbols Isy1 to Isy4, which corresponds to a measurement signal modulated with a modulation scheme, in this case a rectangular 4-QAM. The measurement signal represented by the ideal constellation diagram of FIG. 3 can therefore encode four combinations of two bits, namely 00, 01, 10 and 11. The transmission rate is thus set to two bits per sample. The four symbols Isy1 to Isy4 can, e.g., be stored as reference points in the database unit 30 of the calculation device 10.

FIG. 3 also shows two error vectors on each symbol. For instance, the symbol Isy1 in the first quadrant of the diagram has two associated error vectors e11 and e21. These correspond to the error vectors calculated from two measurement signals. The measurement instrument 100 with which the error vectors e11 and e21 were calculated had two active input paths P1 and P2.

The error vector e11 is calculated, e.g., by the vector signal analyzer unit 40 of the calculation device 10, by subtracting the measurement signal received at input path P1 from the reference point for the symbol Isy1 stored in the database unit 30 of the calculation device 10. The vector e21 is determined mutatis mutandis.

Based on the error vectors e11 and e21, an average error vector eA1 is produced by the calculation device 10. The average error vector eA1 shown in FIG. 3 has, as its first component, the arithmetic mean of the first components of the error vectors e11 and e21 and, as its second component, the arithmetic mean of the second components of the error vectors e11 and e21.

Similarly, to what has been described with respect to the first quadrant, in the second quadrant the symbol Isy2 has two associated error vectors e12 and e22, which were calculated from the measurement signal receive at the first input path P1 and second input path P2 of the measurement instrument 100, respectively. Out of these two error vectors e12 and e22, an average error vector eA2 has been produced, whose components are the arithmetic mean of the components of the error vectors e12 and e22.

Quite generally, for each symbol Isyj there exist two error vectors e1j and e2j, which are calculated by subtracting the first measurement signal received at the first input path P1 and the second measurement signal received at the second input path P2 from the reference point represented by the symbol Isyj. An average error vector eAj is produced for each symbol Isyj, which consists of the arithmetic mean of the error vectors e1j and e2j.

FIG. 4 shows a schematic representation of the ideal constellation diagram of FIG. 3 and a created constellation diagram CT1, as it can be shown to a user through, e.g., a graphical user interface of the display device 20 according to an embodiment of the present invention.

FIG. 4 shows the created constellation diagram CT1, with points sy1, sy2, sy3 and sy4. These points are generated based on the received measurement signals according to the principles of the invention described in the foregoing. The constellation point sy1 is placed at the tip of the average error vector $e_{A1}$, which thus describes the difference between the ideal constellation point Isy1 and the created constellation point sy1. The same applies to the constellation points sy2, sy3 and sy4.

In the embodiment of the invention depicted in FIG. 4, the display device 20 shows, besides the created constellation diagram points sy1 to sy4, all the calculated error vectors and the produced average vectors. This information is useful in order to determine the behavior of the different input paths P1 and P2, in particular in order to detect and identify error sources (e.g., biases due to phase or amplitude effects).

In FIG. 4, as opposed to FIG. 3, the average error vectors for each symbol Isy1 to Isy4 are determined by selecting the shortest vector among the following vectors: 1) the error vectors of each measurement signal for the one state, and 2) a vector whose components are the arithmetic mean of the components of the error vectors of each measurement signal for the one state. This criterion selects as the average vector errors for the first, second and fourth quadrants, $e_{A1}$, eA2 and eA4, respectively, i.e., the arithmetic mean vectors. In the third quadrant, the vector e23 is shorter than the corresponding arithmetic mean vector and, according to this criterion, the average error vector eA3 is identified with e23.

FIG. 5 shows a schematic representation of the ideal constellation diagram of FIG. 3 and a created constellation diagram as it can be shown to a user through, e.g., a graphical user interface of the display device 20 according to another embodiment of the present invention. In this embodiment, only the created and ideal constellation diagrams are shown. In some embodiments of the invention, the ideal constellation diagram points Isy1 to Isy4 do not need to be shown and only the created constellation diagram points sy1 to sy4 are shown by the display device 20 to a user.

FIG. 6 shows a schematic representation of a measurement system 500 according to an embodiment of the third aspect of the invention, comprising a radiofrequency splitter circuit 70 and a measurement instrument 100 according to an embodiment of the first aspect of the present invention.

In FIG. 6 are displayed a device under test DUT, which is adapted to send a measurement signal to the measurement system 500. The measurement signal is received by the radiofrequency splitter circuit 70. The radiofrequency splitter circuit 70 can comprise a single N-way splitter, a number of two-way splitters, or any combination of n-way splitters. In the embodiment depicted in FIG. 6, the radiofrequency splitter circuit 70 comprises two connected 2-way splitters Sp2 and Sp3, where the splitter Sp2 is adapted to receive the measurement signal of the device under test DUT and split it into two split measurement signals. In turn, the splitter Sp3 is adapted to split one of the split measurement signals output by the splitter Sp2 into two additional split measurement signals. With this configuration of the splitters Sp2 and Sp3, the radiofrequency splitter circuit 70 splits the measurement signal coming from the device under test DUT into a first split measurement signal, a second split measurement signal, and a third split measurement signal.

The three split measurement signals are received by the measurement instrument 100, each through one of the input paths P5 to P7 comprised by the measurement instrument 100. Based thereupon, the measurement instrument 100 can create a constellation diagram CT1 in a way analogous to the one described with respect to FIG. 1 and FIGS. 3 to 5, taking into account that in this case there are three input paths and therefore three error vectors per symbol will be present.

The previous description of the disclosed embodiments are merely examples of possible implementations, which are provided to enable any person skilled in the art to make or use the present invention. Various variations and modifications of these embodiments will be readily apparent to those skilled in the art, and the generic principles defined herein may be applied to other embodiments without departing from the spirit or scope of the present disclosure. Thus, the present invention is not intended to be limited to the embodiments shown herein but it is to be accorded the widest scope consistent with the principles and novel features disclosed herein. Therefore, the present invention is not to be limited except in accordance with the following claims.

What I claim is:

1. A measurement instrument, the measurement instrument comprising:
   at least a first and a second input paths, wherein each input path is configured to receive a corresponding measurement signal from a device under test, wherein each measurement signal comprises a number of states;
   a calculation device connected to the at least first and second input paths, configured to calculate an error vector corresponding to each state of each measurement signal, and to produce an average error vector for each state based on the error vectors of each measurement signal corresponding to the same state, wherein the average error vector corresponding to one state is the shortest vector of a group of vectors comprising the error vectors of each measurement signal for the one state and a vector whose components are the arithmetic mean of the components of the error vectors of each measurement signal for the one state; and
   a display device, adapted to create a constellation diagram based on the produced average error vector for each state.

2. The measurement instrument of claim 1, wherein the measurement signals are radiofrequency signals.

3. The measurement instrument of claim 1, further comprising additional input paths, configured to receive each an additional measurement signal, wherein the calculation device is connected to these additional input paths.

4. The measurement instrument of claim 1, wherein the received measurement signals correspond to the different channels generated by a radiofrequency splitter.

5. The measurement instrument of claim 1, wherein the measurement instrument is at least one of:
  a wireless communication test device;
  a test and measurement device for broadcasting;
  a signal analyzer;
  a spectrum analyzer;
  a mobile network testing device.

6. The measurement instrument of claim 1, wherein the calculation device is further configured to compute at least one of an error vector magnitude and a modulation error ratio based on the calculated error vectors.

7. The measurement instrument of claim 1, further comprising a number of analog to digital converters arranged at each input path, configured to convert a received analog measurement signal into a corresponding digital measurement signal.

8. The measurement instrument of claim 1, wherein the error vector corresponding to a state is calculated based on the difference between the state of the received measurement signal and a predetermined reference signal for the state.

9. The measurement instrument of claim 1, wherein the average error vector corresponding to a state is a vector whose components are the arithmetic mean of the components of the error vectors corresponding to the state.

10. The measurement instrument of claim 1, wherein the display device is further configured to display the error vectors for each state of the measurement signals.

11. The measurement instrument of claim 1, wherein the calculation device comprises a database unit, configured to store a two-dimensional reference point corresponding to each state.

12. The measurement instrument of claim 1, wherein the display device is configured to create the constellation diagram by placing the produced average error vector for each state on a two-dimensional plot, and wherein the origin of the produced average error vector for each state is the reference point corresponding to each state.

13. The measurement instrument of claim 1, wherein the calculation device comprises a vector signal analyzer unit, connected to at least one of the input paths and configured to calculate the error vectors associated to the measurement signal received by the at least one input path.

14. A method for creating a constellation diagram, the method comprising:
  providing a measurement instrument with at least a first and a second input paths, a calculation device connected to the at least first and second input paths, and a display device;
  receiving at the at least first input path and second input path a corresponding measurement signal from a device under test, wherein each measurement signal comprises a number of states;
  calculating an error vector corresponding to each state of each measurement signal;
  producing an average error vector for each state based on the error vectors of each measurement signal corresponding to the same state, wherein producing an average error vector comprises selecting the shortest vector of a group of vectors comprising the error vectors of each measurement signal for the one state and a vector whose components are the arithmetic mean of the components of the error vectors of each measurement signal for the one state; and
  creating a constellation diagram based on the produced average error vector for each state.

15. The method of claim 14, further comprising:
  generating at least two channels by splitting a signal from a device under test by a radiofrequency splitter, wherein the first channel corresponds to the first measurement signal and the second channel corresponds to the second measurement signal.

16. The method of claim 14, further comprising:
  computing, based on the calculated error vectors, at least one of an error vector magnitude and a modulation error ratio.

17. A measurement system, the measurement system comprising:
  a radiofrequency splitter circuit, configured to generate at least two channels by splitting a signal from a device under test into at least a first split measurement signal and a second split measurement signal; and
  a measurement instrument, the measurement instrument comprising:
    at least a first and a second input paths, wherein each input path is configured to receive a corresponding measurement signal from a device under test, wherein each measurement signal comprises a number of states;
    a calculation device connected to the at least first and second input paths, configured to calculate an error vector corresponding to each state of each measurement signal, and to produce an average error vector for each state based on the error vectors of each measurement signal corresponding to the same state, wherein the average error vector corresponding to one state is the shortest vector of a group of vectors comprising the error vectors of each measurement signal for the one state and a vector whose components are the arithmetic mean of the components of the error vectors of each measurement signal for the one state; and
    a display device, adapted to create a constellation diagram based on the produced average error vector for each state,
    wherein the measurement instrument is configured to receive each of the channels generated by the radiofrequency splitter circuit at a corresponding input path.

18. The measurement system of claim 17, wherein the radiofrequency splitter circuit comprises a number of connected two-way splitters.

* * * * *